United States Patent
Kim

(10) Patent No.: US 6,503,806 B1
(45) Date of Patent: Jan. 7, 2003

(54) METHOD FOR FORMING GATE ELECTRODE OF A SEMICONDUCTOR DEVICE WITH DUAL SPACER TO PROTECT METAL PORTION OF GATE

(75) Inventor: Hyeon Soo Kim, Taegu (KR)

(73) Assignee: Hyundai Electronics Industries Co., Ltd., Ichon (JP)

( * ) Notice: Subject to any disclaimer, the term of this patent is extended or adjusted under 35 U.S.C. 154(b) by 0 days.

(21) Appl. No.: 09/472,202

(22) Filed: Dec. 27, 1999

(30) Foreign Application Priority Data

Dec. 28, 1998 (KR) .............................. 98-59568

(51) Int. Cl.[7] .................. H01L 21/336; H01L 21/3205
(52) U.S. Cl. ..................... 438/304; 438/592; 438/596
(58) Field of Search ............................ 438/303, 304, 438/592, 595, 596

(56) References Cited

U.S. PATENT DOCUMENTS

| | | | |
|---|---|---|---|
| 5,071,788 A | | 12/1991 | Joshi |
| 5,411,906 A | * | 5/1995 | Johnson et al. |
| 5,498,555 A | * | 3/1996 | Lin |
| 5,599,725 A | | 2/1997 | Dorleans et al. |
| 5,920,783 A | * | 7/1999 | Tseng et al. |
| 5,940,725 A | * | 8/1999 | Hunter et al. |
| 5,965,919 A | * | 10/1999 | Yoo |
| 6,040,241 A | * | 3/2000 | Lee et al. |
| 6,066,875 A | * | 5/2000 | Chen |

* cited by examiner

Primary Examiner—Richard Booth
Assistant Examiner—Ron Pompey
(74) Attorney, Agent, or Firm—Jacobson Holman PLLC

(57) ABSTRACT

Disclosed is a method for forming a gate electrode of a semiconductor device, the method comprises the steps of: stacking a gate oxide film, a doped first silicon film, a diffusion preventing film, a metal film having a high melting point and a mask insulating film on a semiconductor substrate; forming a gate electrode by patterning a resultant stack structure; forming a second silicon film on an entire surface of a resultant structure; forming an oxidation preventing film on an entire surface of a resultant structure; forming a spacer on a side wall of the gate electrode by anisotrophically etching the oxidation preventing film and the second silicon film; and forming a gate reoxide film on the semiconductor substrate by oxidizing the semiconductor substrate.

20 Claims, 2 Drawing Sheets

METHOD FOR FORMING GATE ELECTRODE OF A SEMICONDUCTOR DEVICE WITH DUAL SPACER TO PROTECT METAL PORTION OF GATE

BACKGROUND OF THE INVENTION

1. Field of the Invention

The present invention relates to a method for forming a gate electrode of a semiconductor device, and more particularly, the present invention relates to a method for forming a gate electrode of a semiconductor device, which prevents properties of a semiconductor device from being degraded due to the fact that metal having a high melting point and used as a gate electrode when implementing a thermal treating process of a gate oxide film under an oxidizing atmosphere for improving the film's quality thereof, is oxidized.

2. Description of the Related Art

Generally, a doped polysilicon is widely used as a gate electrode of a semiconductor device.

While a gate electrode formed using a polysilicon has an advantage of its processes being stable due to a high specific resistance of the polysilicon, design rule is decreased, thereby it is difficult to increase an operating speed of a semiconductor device.

To cope with this problem, it is disclosed in the art that high melting point metal such as tungsten having a low specific resistance be used to form a gate electrode.

In light of the above statements, while not shown in a drawing, a method for forming a gate electrode of a semiconductor device according to the conventional art will be described hereinbelow in connection with the case that tungsten is used as the high melting point metal.

First, a gate oxide film is formed on a semiconductor substrate to have a constant thickness. Then, a first polysilicon film, a tungsten film for a gate electrode and a mask oxide film are formed on a resultant structure.

Then, by etching a resultant structure using a gate electrode mask, a gate electrode is patterned. Thereafter, an oxidation preventing film spacer is formed on a side wall of the gate electrode using a second polysilicon film.

However, when a gate reoxide film is formed by an oxidizing process to compensate a gate oxide film which is etched by ion-implanting and etching processes, if a degree of oxidation is not properly controlled, the tungsten film can be oxidized.

In other words, in the method for forming a gate electrode of a semiconductor device according to the conventional art, as mentioned above, in the case that tungsten being metal having a high melting point is used as a gate electrode, the tungsten film can be oxidized when the gate reoxide film is formed by the oxidizing process, whereby properties of a semiconductor device can be degraded and according to this, it is difficult to accomplish high integration and high speed of the semiconductor device.

SUMMARY OF THE INVENTION

Accordingly, the present invention has been made in an effort to solve the problems occurring in the related art, and an objective of the present invention is to provide a method for forming a gate electrode of a semiconductor device, in which an oxidation preventing film is formed by a stack structure of a polysilicon film and a nitride film, thereby improving film quality of a gate oxide film on a semiconductor device which is damaged when implementing a patterning process of a gate electrode.

Another objective of the present invention is to provide a method for forming a gate electrode of a semiconductor device, which prevents properties of a gate electrode formed by metal having a high melting point from being degraded when thermally treating a gate oxide film under an oxidizing atmosphere for forming a gate reoxide film to be used in a lightly-doped drain (LDD) ion-implanting process, thereby enabling a semiconductor device to be highly integrated.

In accordance with one aspect, the present invention provides a method for forming a gate electrode of a semiconductor device, comprising the steps of: stacking a gate oxide film, a doped first silicon film, a diffusion preventing film, a metal film having a high melting point for a gate electrode and a mask insulating film on a semiconductor substrate; forming a gate electrode by patterning a resultant stack structure; forming a second silicon film on an entire surface of a resultant structure; forming an oxidation preventing film on an entire surface of a resultant structure; forming a spacer on a side wall of the gate electrode by anisotrophically etching the oxidation preventing film and the second silicon film; and forming a gate reoxide film by oxidizing the semiconductor substrate.

In accordance with another aspect, the present invention provides a method for forming a gate electrode of a semiconductor device, comprising the steps of: stacking a gate oxide film, a doped first polysilicon film, a diffusion preventing film, a tungsten film and a mask insulating film on a semiconductor substrate; forming a gate electrode by patterning a resultant stack structure; forming a second polysilicon film on an entire surface of resultant structure; forming an nitride film for an oxidation preventing film on an entire surface of a resultant structure; forming a spacer on a side wall of the gate electrode by anisotrophically etching the nitride film and the polysilicon film; and forming a gate reoxide film on the semiconductor substrate by oxidizing a lower portion of the second polysilicon film and the semiconductor substrate.

BRIEF DESCRIPTION OF THE DRAWINGS

The above objectives, and other features and advantages of the present invention will become more apparent after a reading of the following detailed description when taken in conjunction with the drawings, in which.

DETAILED DESCRIPTION OF PREFERRED EMBODIMENTS

Figure 1:
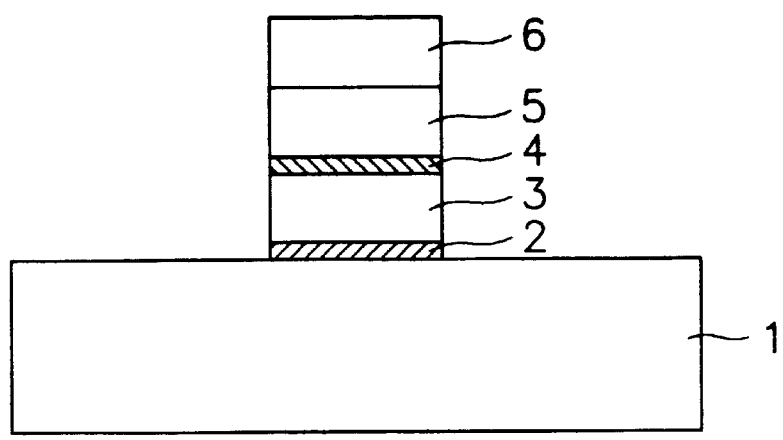
FIGS. 1 through 4 are cross-sectional views for explaining a method for forming a gate electrode of a semiconductor device in accordance with an embodiment of the present invention.

Reference will now be made in greater detail to a preferred embodiment of the invention, an example of which is illustrated in the accompanying drawings. Wherever possible, the same reference numerals will be used throughout the drawings and the description to refer to the same or like parts.

FIGS. 1 through 4 are cross-sectional views for explaining a method for forming a gate electrode of a semiconductor device in accordance with an embodiment of the present invention.

First, a device isolating film (not shown) is formed on an inactive region of a semiconductor substrate 1.

Then, as shown in FIG. 1, on an entire surface of the resultant structure, there are stacked a gate oxide film 2, a doped first polysilicon film 3, a diffusion preventing film 4, a tungsten film 5 and a mask insulating film 6.

At this time, the gate oxide film 2 has a thickness of 1–100 Å, the first polysilicon film 3 has a thickness of 500–1000 Å, and the diffusion preventing film 4 is formed by TiN or WN and has a thickness of 10–500 Å.

Also, the tungsten film 5 is formed by a sputtering method or a chemical vapor deposition method, to have a thickness of 100–2000 Å; and the mask insulating film 6 is formed using an oxide film, a nitride film or a stack structure of them, to have a thickness of 1000–2000 Å.

At this time, the diffusion preventing film 4 can also be formed using an oxide film, a nitride film or a stack structure of them instead of TiN or WN, to have a thickness of 50–500 Å.

Thereafter, by etching the stack structure using a gate electrode mask (not shown), a gate electrode is patterned.

Figure 2:
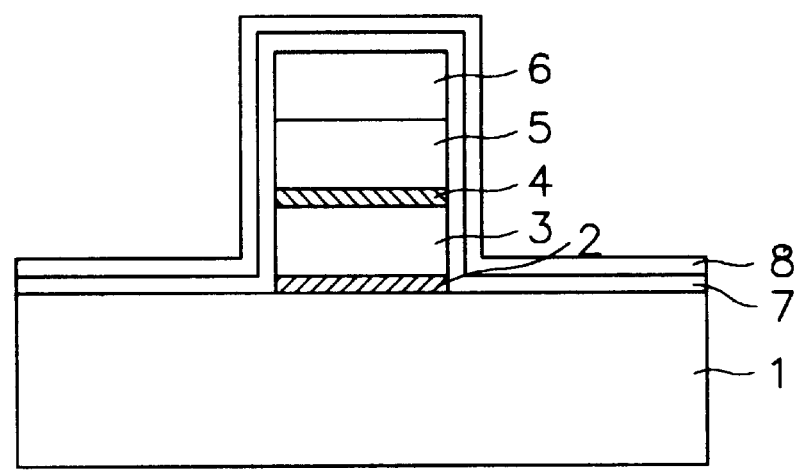

Following this, as shown in FIG. 2, a second polysilicon film 7 and an oxidation preventing film 8 are formed on an entire surface of a resultant structure to have constant thickness, respectively. At this time, the oxidation preventing film 8 is formed by a nitride film.

Figure 3:
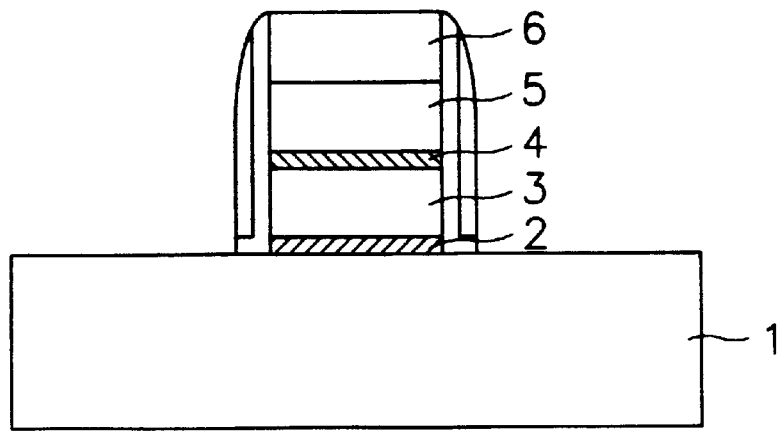

Then, as shown in FIG. 3, by anisotrophically etching the oxidation preventing film 8 and the second polysilicon film 7, a spacer is formed on a side wall of the gate electrode.

Figure 4:
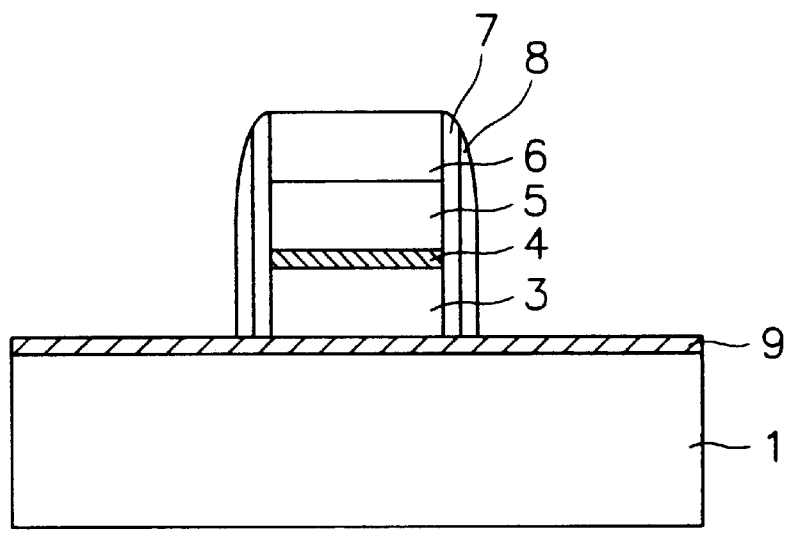

Next, as shown in FIG. 4, an oxidizing process is implemented to compensate the semiconductor substrate 1 which is damaged when patterning the gate electrode and/or forming the spacer and to form a gate reoxide film 9 on the semiconductor substrate 1, which is to be used in a subsequent ion-implanting process.

A lower portion of the patterned second polysilicon film 7 is oxidized through the oxidation process. Then, the oxidation process is carried out under oxygen atmosphere in a furnace.

At this time, it is preferred that the gate reoxide film 9 is formed to have thickness of 10–300 Å.

As described above, by the method for forming a gate electrode of a semiconductor device according to the present invention, advantages are provided as described below.

In the method for forming a gate electrode of a semiconductor device according to the present invention, due to the fact that metal having a high melting point is used to form a gate electrode and a circumferential outer surface of the metal having a high melting point is surrounded by an insulating film, properties of the gate electrode are prevented from being degraded when implementing a thermal treating process for compensating a gate oxide film for damage, whereby it is possible to highly integrate a semiconductor device and improve properties and reliability of the semiconductor device.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method for preventing oxidation of a metal film during formation of a gate reoxide film following formation of a gate electrode of a semiconductor device, comprising the steps of:

stacking a gate oxide film, a doped first silicon film, a diffusion preventing film, a metal film having a high melting point and a mask insulating film on a semiconductor substrate;

forming a gate electrode by patterning a resultant stack structure;

forming a second silicon film on an entire surface of a resultant structure;

forming an oxidation preventing film on an entire surface of a resultant structure;

anisotrophically etching the oxidation preventing film and the second silicon film in a single step to form a spacer on a side wall of said gate electrode; and forming a gate reoxide film on the semiconductor substrate by oxidizing the semiconductor substrate, said spacer preventing oxidation of said metal film.

2. A method as claimed in claim 1, wherein the gate oxide film is formed to have thickness of 1–100 Å.

3. A method as claimed in claim 1, wherein the first silicon film is formed to have thickness of 500–1000 Å.

4. A method as claimed in claim 1, wherein the diffusion preventing film is formed by TiN or WN to have thickness of 10–500 Å.

5. A method as claimed in claim 1, wherein the diffusion preventing film is formed by an oxide film, a nitride film or a stack structure of them and is formed to have thickness of 50–500 Å.

6. A method as claimed in claim 1, wherein a tungsten film is used as the metal film having a high melting point.

7. A method as claimed in claim 6, wherein the tungsten film is formed by a sputtering method or a chemical vapor deposition method, to have thickness of 100–2000 Å.

8. A method as claimed in claim 1, wherein the mask insulating film is formed by an oxide film, a nitride film or a stack structure of them and is formed to have thickness of 1000–2000 Å.

9. A method as claimed in claim 1, wherein the oxidation preventing film is formed by a nitride film.

10. A method as claimed in claim 1, wherein the gate reoxide film is formed to have thickness of 10–300 Å.

11. A method as claimed in claim 1, wherein the oxidation process is carried out under the oxygen atmosphere in the furnace.

12. A method as claimed in claim 1, wherein the gate reoxide film includes a lower portion of the second silicon film.

13. A method as claimed in claim 1, wherein the first and second silicon film is a polysilicon film.

14. A method for preventing oxidation of a tungsten film during formation of a gate reoxide film following formation of a gate electrode of a semiconductor device, comprising the steps of:

stacking a gate oxide film, a doped first polysilicon film, a diffusion preventing film, a tungsten film and a mask insulating film on a semiconductor substrate;

forming a gate electrode by patterning a resultant stack structure;

forming a second polysilicon film on an entire surface of a resultant structure;

forming a nitride film as an oxidation preventing film on an entire surface of a resultant structure;

forming a spacer on a side wall of the gate electrode by anisotrophically etching the nitride film and the second polysilicon film in a single step and without oxidation; and forming a gate reoxide film on the semiconductor substrate by oxidizing a lower portion of the second polysilicon film and the semiconductor substrate, said spacer preventing oxidation of said tungsten film during said forming of said gate reoxide film.

15. A method as claimed in claim 14, wherein the gate oxide film has a thickness of 1–100 Å and the first silicon film has thickness of 500–1000 Å.

16. A method as claimed in claim 14, wherein the diffusion preventing film is formed by TiN, WN, oxide film, nitride film or stacked structure of them, and has thickness of 10–500 Å.

17. A method as claimed in claim 14, wherein the tungsten film is formed by sputtering method or CVD method and has thickness of 100–2000 Å.

18. A method as claimed in claim 14, wherein the mask insulating film is formed by an oxide film, a nitride film or a stack structure of them and is formed to have thickness of 1000–2000 Å.

19. A method as claimed in claim 14, wherein the oxidation process is carried out under the oxygen atmosphere in the furnace.

20. A method as claimed in claim 14, wherein the gate reoxide film has thickness of 10–300 Å.

* * * * *